United States Patent
Li (10) Patent No.: US 10,349,536 B2
(45) Date of Patent: Jul. 9, 2019

(54) WALL-MOUNTED DEVICE

(71) Applicant: HAN CHUANG INTERNATIONAL CO., LTD., Taipei (TW)

(72) Inventor: Chao-Han Li, Taipei (TW)

(73) Assignee: HAN CHUANG INTERNATIONAL CO., LTD., Taipei (TW)

( * ) Notice: Subject to any disclaimer, the term of this patent is extended or adjusted under 35 U.S.C. 154(b) by 14 days.

(21) Appl. No.: 15/693,470

(22) Filed: Aug. 31, 2017

(65) Prior Publication Data

US 2019/0069419 A1 Feb. 28, 2019

(51) Int. Cl.
| | |
|---|---|
| *H05K 5/00* | (2006.01) |
| *H01R 13/66* | (2006.01) |
| *H01R 13/70* | (2006.01) |
| *H01R 25/00* | (2006.01) |
| *H02G 3/12* | (2006.01) |
| *H02G 3/08* | (2006.01) |
| *H02B 1/42* | (2006.01) |
| *H01H 47/22* | (2006.01) |
| *G01R 15/18* | (2006.01) |
| *G01R 21/06* | (2006.01) |
| *G01K 13/00* | (2006.01) |

(52) U.S. Cl.
CPC ......... *H05K 5/0026* (2013.01); *G01K 13/00* (2013.01); *G01R 15/183* (2013.01); *G01R 21/06* (2013.01); *H01H 47/22* (2013.01); *H01R 13/665* (2013.01); *H01R 13/70* (2013.01); *H01R 25/006* (2013.01); *H02B 1/42* (2013.01); *H02G 3/081* (2013.01); *H02G 3/123* (2013.01)

(58) Field of Classification Search
CPC .................................................. H05K 5/0026
USPC ........................................................... 174/481
See application file for complete search history.

(56) References Cited

U.S. PATENT DOCUMENTS

| | | | | |
|---|---|---|---|---|
| 3,836,936 | A * | 9/1974 | Clement ............... | H01R 25/14 174/481 |
| 4,485,282 | A * | 11/1984 | Lee .......................... | H02G 3/18 174/53 |
| 9,892,630 | B1 * | 2/2018 | Strods ...................... | H04W 4/70 |
| 2010/0133000 | A1 * | 6/2010 | Trolese .................... | H02G 3/14 174/503 |
| 2013/0040489 | A1 * | 2/2013 | Fang ...................... | H01R 25/006 439/536 |
| 2014/0126261 | A1 * | 5/2014 | Newman, Jr. ......... | H02M 1/081 363/128 |
| 2014/0199867 | A1 * | 7/2014 | Rogers .................... | H01R 27/00 439/173 |

FOREIGN PATENT DOCUMENTS

TW M538278 U 3/2017

* cited by examiner

*Primary Examiner* — Stanley Tso
(74) *Attorney, Agent, or Firm* — Cheng-Ju Chiang (57) ABSTRACT

Disclosed is a wall-mounted device, which is mainly provided with a base and a cover plate, and the at least one module circuit board is provided in the cover plate. The power terminal of at least one module circuit board is electrically connected to an exterior live wire circuit of the base, so the interior live wire circuit is able to independently supply power to the module circuit board of the cover plate. As the result, the base is able to fit or replace with any cover plate provided with module circuit board, and connects to any electronic device or network to remotely control and operate.

14 Claims, 9 Drawing Sheets

WALL-MOUNTED DEVICE

BACKGROUND OF THE INNOVATION PATENT

1. Field of the Innovation Patent

The present innovation patent relates to a wall-mounted device, particularly with regard to a design, which is provided with an interior live wire circuit and an exterior live wire circuit, to attain an effect that the exterior live circuit supplies power and detects circuit independently, and is applied to an outlet device mounted in the wall and the like.

2. The Related Arts

Nowadays, the electricity consumption has increased year by year and the electricity prices are gradually rising. Therefore, saving energy becomes a crucial issue.

Other than the usage of supplying power to electrical appliances or electrical devices, recently, outlet switches has also been formed a smart outlet that can detect circuit and control circuit, so as to manage electrical appliances or electrical devices or to analyze the electricity consumption of electrical appliances or electrical devices.

However, the conventional smart outlet design likes the smart outlet and control system, as shown in Taiwan patent No. M538278. The switch control circuit is electrically connected between the live wire input terminal and the live wire output terminal of the smart outlet to control the open/closed state of the live wire. Hence, when the switch control circuit disconnects the live wire input terminal from the live wire output terminal of the smart outlet, the power is not only stop supplied to the electrical appliances plugged in the smart device, but also to all electronic modules, electrically connected to the smart outlet, such as wireless transmission module, power module, electrical detection module, display module, temperature detection module, etc. Thus, it is inconvenient to use, and reduce the useful life of electronic module or damage electronic components because of the frequent open/closed switch of the live wire. Besides, the unsolved part is that the volume is too large to be placed into the smart outlet because of the added electronic module. Further, electronic module cannot be directly systematically built, so it need to be additionally bought and cannot be directly seen as a "built materials", and it only detects the external current.

Hence, in view of the above problems, the named inventor(s) of the present innovation patent makes painstaking efforts to research and study in cooperation with application of related technical theory and rules. A device, having an effect of supplying power independently, which is mounted in a wall can effectively improve the above mentioned drawbacks and is finally proposed.

SUMMARY OF THE INNOVATION PATENT

The mainly purpose of the present invention is providing a wall-mounted device, which is mainly provided with a base and a cover plate, and the at least one module circuit board is provided in the cover plate. The power terminal of at least one module circuit board is electrically connected to an exterior live wire circuit of the base, so the interior live wire circuit is able to independently supply power to the module circuit board of the cover plate. As the result, the base is able to fit or replace with any cover plate provided with module circuit board, and connects to any electronic device or network to remotely control and operate.

The other purpose of the present invention is providing a wall-mounted device, the wall-mounted device comprise a base which is configured in a wall and provided with a concave part, which is disposed with an exterior live wire circuit which is connected to a live wire provided in the wall in series, so as to attain an effect that the exterior live circuit supplies power and detects circuit independently. A switch is provided between the interior live wire circuit and the exterior live circuit to control the open/closed state of current transmitting, so the efficiency of current transmitting of the interior wire circuit can be controlled to increase the usability.

The another purpose of the present invention is providing a wall-mounted device, the exterior live wire circuit of the base and the live wire provided in the wall are connected in series. The exterior live wire circuit is able to combined with an induction coil or a temperature sensor, so as to detect current and voltage of the exterior live wire circuit, or to detect the temperature of the interior live wire circuit, so as to provide an effect of detecting circuit independently and to completely process smart statics and analysis, and thus to increase the convenience of whole.

DETAILED DESCRIPTION OF PREFERRED EMBODIMENT

With reference to FIGS. 1 to 9, FIGS. 1 to 9 are schematics of an embodiment of the present invention. The wall-mounted device of the present invention is mainly applied to an outlet device mounted in the wall and the like, so that an effect of supplying power and detecting circuit independently can be attained to completely process smart statics and analysis, and the wall-mounted device can be connected to any electronic device or network to remotely control and operate.

Referring to the first embodiment of the wall-mounted device of the present invention, the device is provided with a base 10. The base 10 is provided in a wall. The base 10 is provided with a concave part 11. The concave part 11 is disposed with an interior live wire circuit 30 extending along and disposed in a central longitudinal region 111 of the concave part 11 which is defined around a central longitudinal line of the concave part 11 and an exterior live wire circuit 20 extending along and disposed in a peripheral longitudinal region 112 of the concave part 11 formed next to the central longitudinal region 111 in a parallel, side-by-side relationship and spaced away from the central longitudinal line of the concave part 11 as shown in FIG. 6 and FIG. 9, wherein the exterior live wire circuit 20 is connected to a live wire provided in the wall in series to receive the AC power transmitted by the power system of the main switch.

Figure 6:
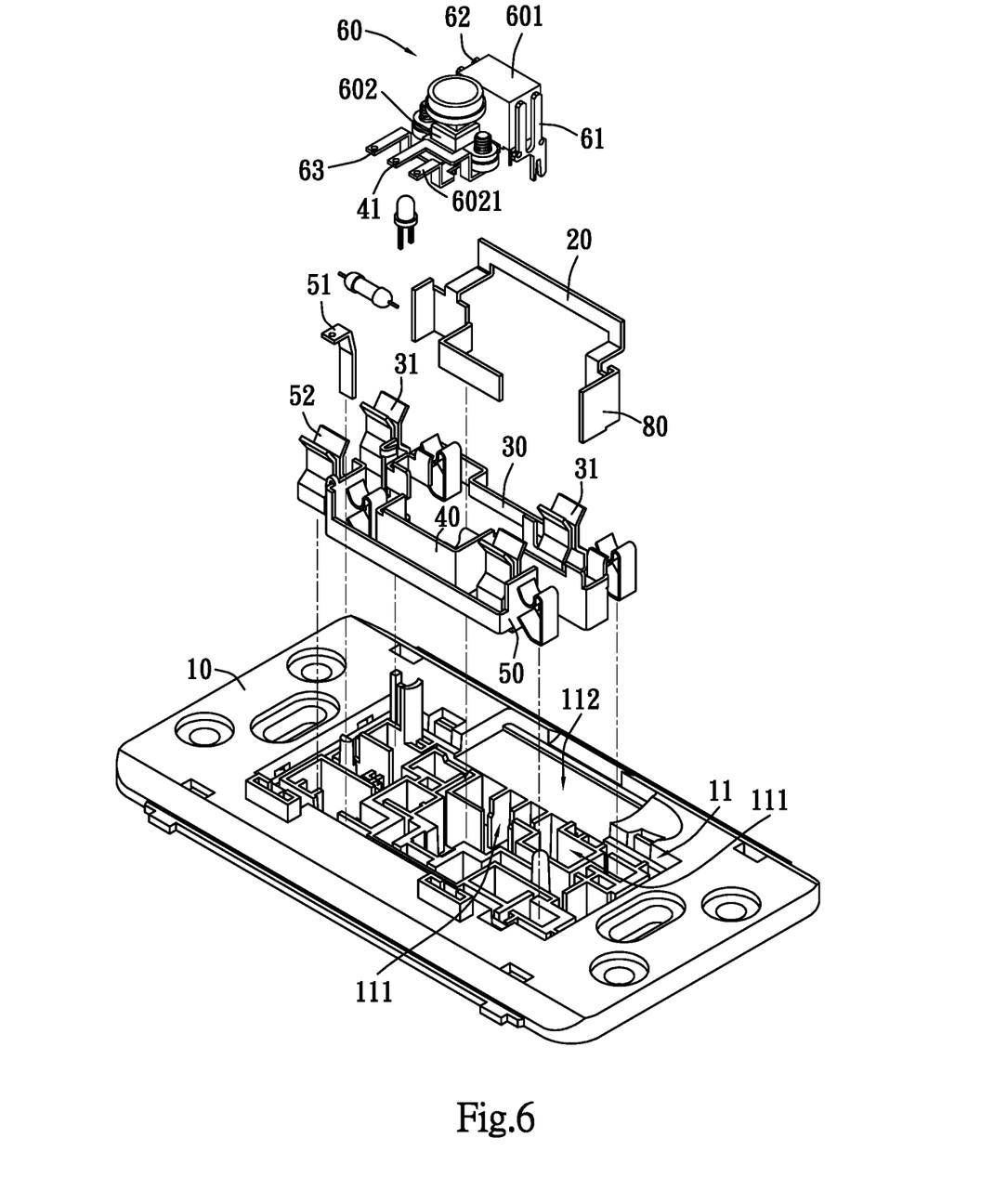
FIG. 6 is an exploded view illustrating the first embodiment according to the present invention.
Figure 9:
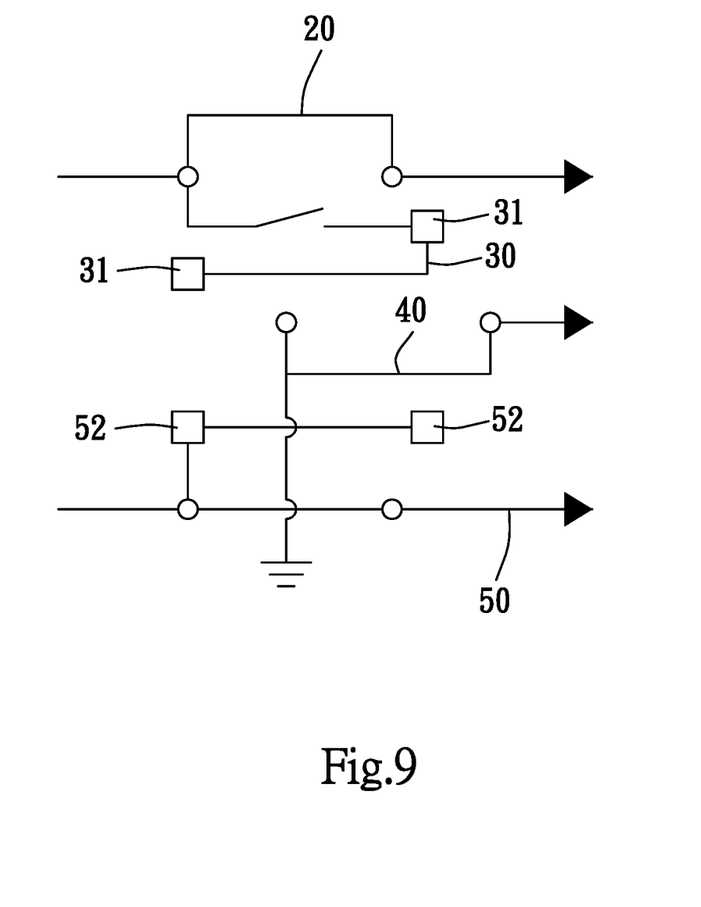
FIG. 9 is a layout schematic diagram illustrating the exterior live wire circuit, the interior live wire circuit, the earth wire circuit, and the neutral wire circuit according to the present invention.

Further, the concave part 11 of the base 10 is not only disposed with the above circuit, but also an earth wire circuit 40 and a neutral wire circuit 50 as shown in FIG. 6 and FIG. 9, wherein the neutral wire circuit 50 is connected to a neutral wire provided in the wall in series to transmit current back to the power system of the main switch. The potential is usually equal or close to zero, and the earth wire circuit 40 is connected with, in series, a conductor which has a potential equal to earth to prevent equipment or people from damage.

A switch 60 is provided between the interior live wire circuit 30 and the exterior live wire circuit 20 of the base 10. The switch 60 is configured by at least one elements selected from a group including tactile switch, push switch, slide switch, button switch, and relay switch, not shown in Figures, to control the open/closed state of current transmitting of the interior wire circuit 30 via the switch 60. In other words, the interior live wire circuit 30 and the exterior live wire circuit 20 can be open circuit (non-conducting state) or closed circuit (conducting state).

Figure 7:
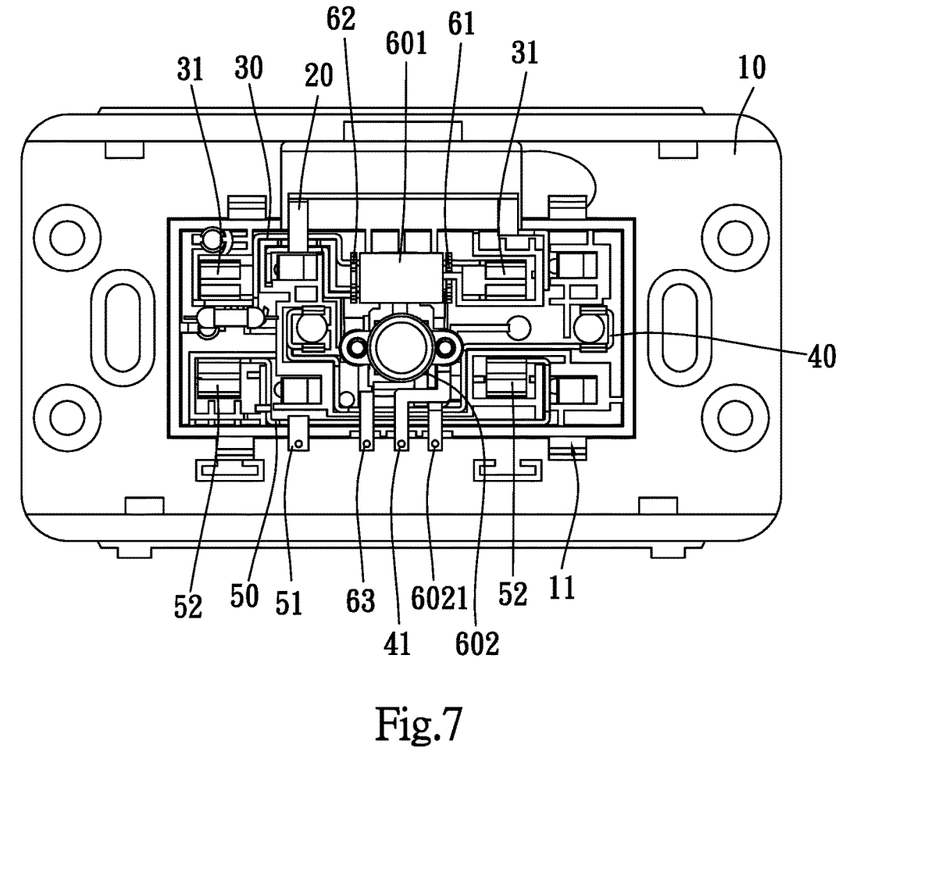
FIG. 7 is a perspective view illustrating the cover plate combined with the base in accordance with the first embodiment of the present invention.
Figure 8:
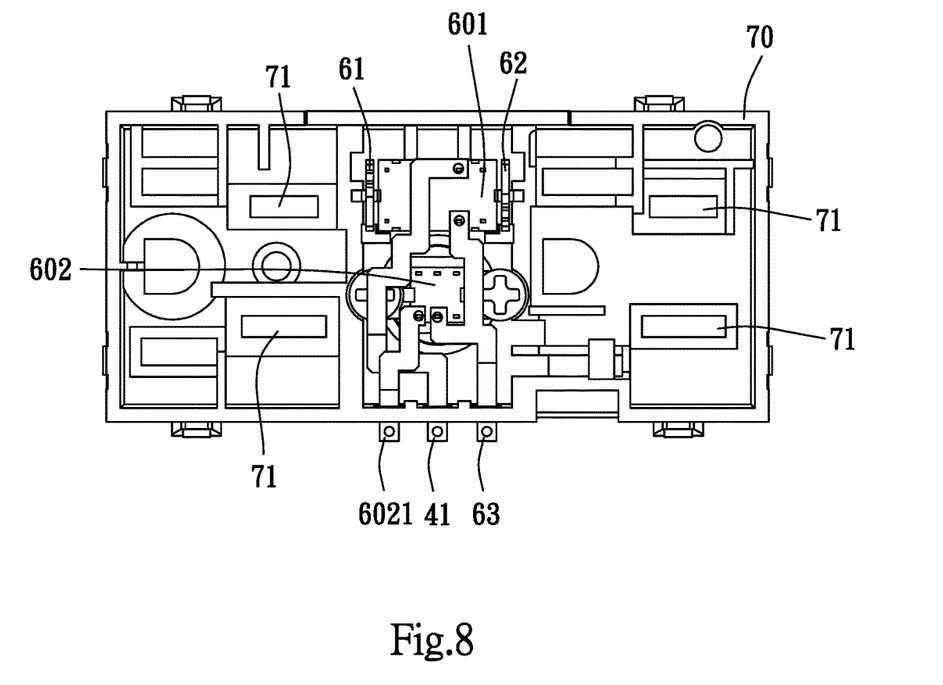
FIG. 8 is a schematic diagram illustrating the switch received by the plug case in accordance with the first embodiment of the present invention.

The switch 60 between the interior live wire circuit 30 and the exterior live circuit 20 of the base 10 is configured by a relay 601 and a tactile switch 602 as shown in FIG. 6 and FIG. 7. One side of the relay 601 is combined with a first live wire metal sheet 61. The first live wire metal sheet 61 is connected with the interior live wire circuit 30 of the base 10. The other side of the relay 601 is combined with a second live wire metal sheet 62. The second live wire metal sheet 62 is connected with the exterior live wire circuit 20 of the base 10. The tactile switch 602 is combined with a signal metal sheet 63. One side of the signal metal sheet 63 is extended to connect to the relay 601, and the other side of the signal metal sheet 63 is extending outwardly to enable the tactile switch 602, as shown in FIG. 8, to transmit a signal to the relay 601 via the signal metal sheet 63, so as to control the open/closed state of current transmitting of the interior wire circuit 30. In other words, the interior live wire circuit 30 and the exterior live wire circuit 20 can be open circuit (non-conducting state) or closed circuit (conducting state).

Figure 1:
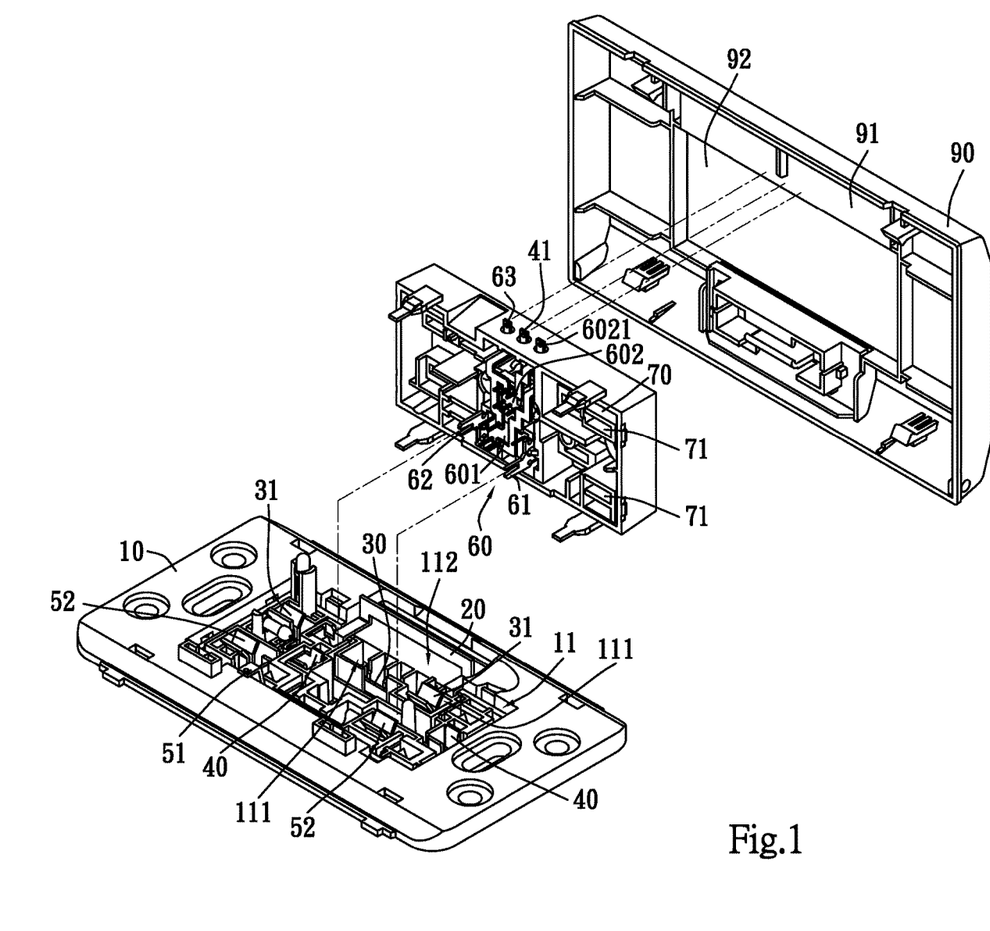
FIG. 1 is an exploded view illustrating the second embodiment according to the present invention.

Furthermore, the interior live wire circuit 30 of the base 10 is connected with at least one elastic sheet 31, and the neutral wire circuit 50 is connected with at least one elastic sheet 52 as shown in FIG. 6. The base 10 is combined to a plug case 70. The plug case 70 is provided with at least one set of holes 71. The at least one set of holes 71 is separately corresponding to the position of the elastic sheet 31 of the interior live wire circuit 30 and the position of the elastic sheet 52 of the neutral wire circuit 50, as shown in FIG. 1, for being plugged by an electrical appliance or an electrical device. When the interior live wire circuit 30 and the exterior live wire circuit 20 are formed as closed circuit and conducting state, the interior live wire circuit 30 is able to supply power via the elastic sheet 31.

The exterior live wire circuit 20 of the base 10 is connected to the live wire provided in the wall in series so that power can be supplied independently from the interior live wire circuit 30 of the base 10. The exterior live wire circuit 20 is combined with an induction coil (not shown in Figures) to detect voltage and current of the exterior live wire circuit 20, or combined with a temperature sensor 80 (as shown in FIG. 6) to detect temperature of the exterior live wire circuit 20, so as to provide an effect of detecting circuit independently and to completely process smart statics and analysis.

Referring to the second embodiment of the wall-mounted device of the present invention, which is mainly provided with a base 10 and a cover plate 90, and the cover plate 90 is combined on the base 10 as shown in FIG. 1, and at least one module circuit board 91 is provided in the cover plate 90. The base 10 is provided in the wall which is similar to the first embodiment. The base 10 is provided with a concave part 11, and the concave part is disposed with an interior live wire circuit 30, an exterior live wire circuit 20, a neutral wire circuit 50 and an earth wire circuit 40, which the configuration of the interior live wire circuit 30, exterior live wire circuit 20, the neutral wire circuit 50 and the earth wire circuit 40 can be referred to the first embodiment. Furthermore, the effect, which the exterior live wire circuit 20 of the base 10 is combined with the induction coil, not shown in figures, or the temperature sensor 80 to detect circuit independently, can be also referred to the first embodiment.

Figure 4:
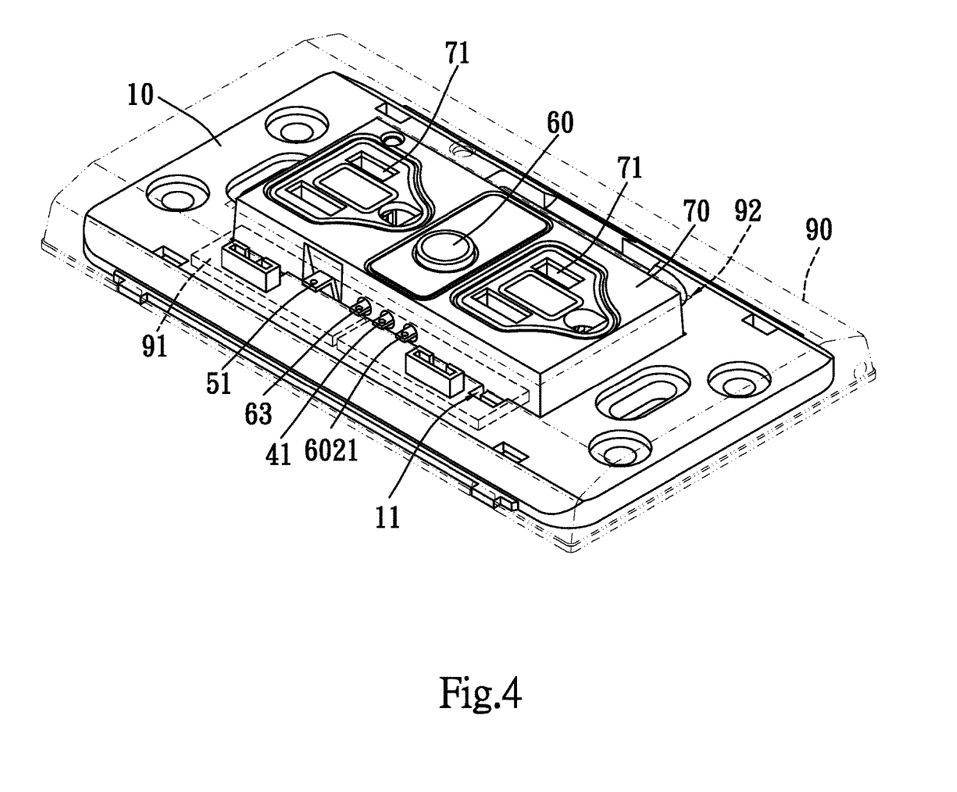
FIG. 4 is a perspective view illustrating the cover plate combined with the base in accordance with the second embodiment of the present invention.
Figure 5:
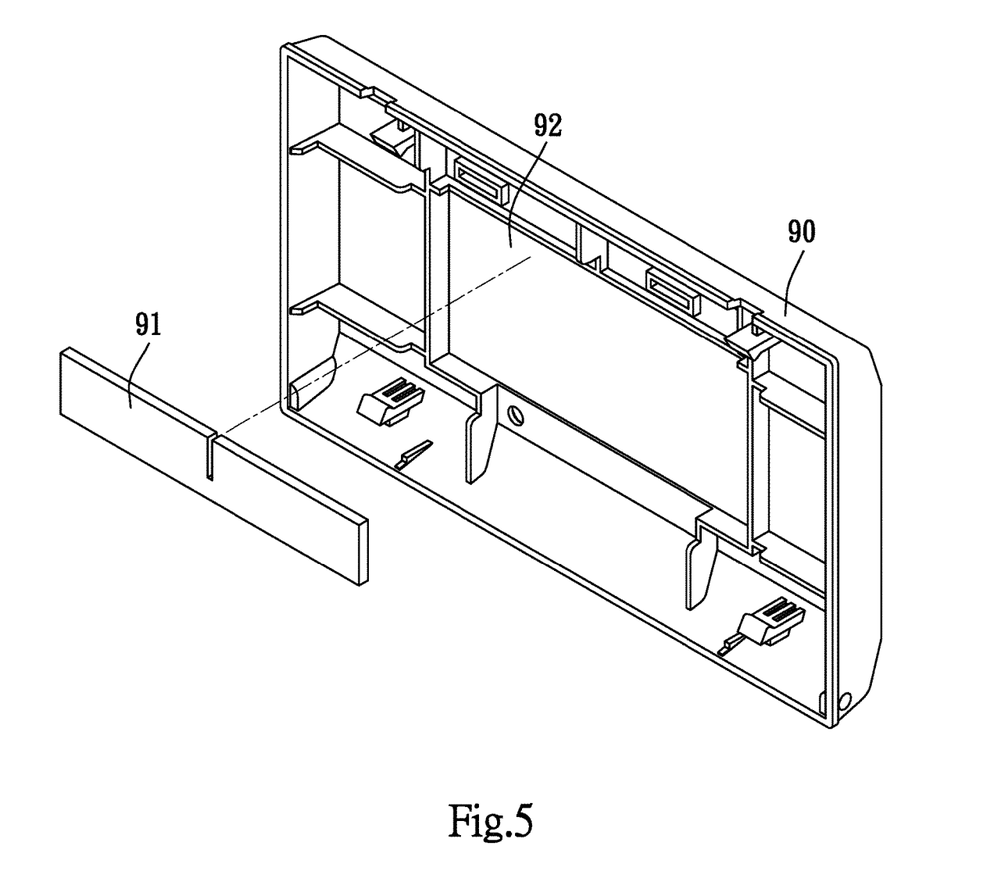
FIG. 5 is an exploded view illustrating the cover plate and the module circuit board in accordance with the second embodiment of the present invention.

The differences between the neutral wire circuit 50 and earth wire circuit 40 configured in the second embodiment of the present invention and configured in first embodiment is that the neutral wire circuit 50 is combined with a metal sheet 51, and one side of metal sheet 51 is connected to at least one module circuit board 91 of the cover plate 90 as shown in FIGS. 1 and 4 so as to provide grounding. The earth wire circuit 40 is combined with a negative terminal metal sheet 41, one side of the negative terminal metal sheet 41 is electrically connected with at least one module circuit board 91 of the cover plate 90, so as to provide a function of negative terminal and grounding with at least one module circuit 91 of the cover plate 90.

Figure 2:
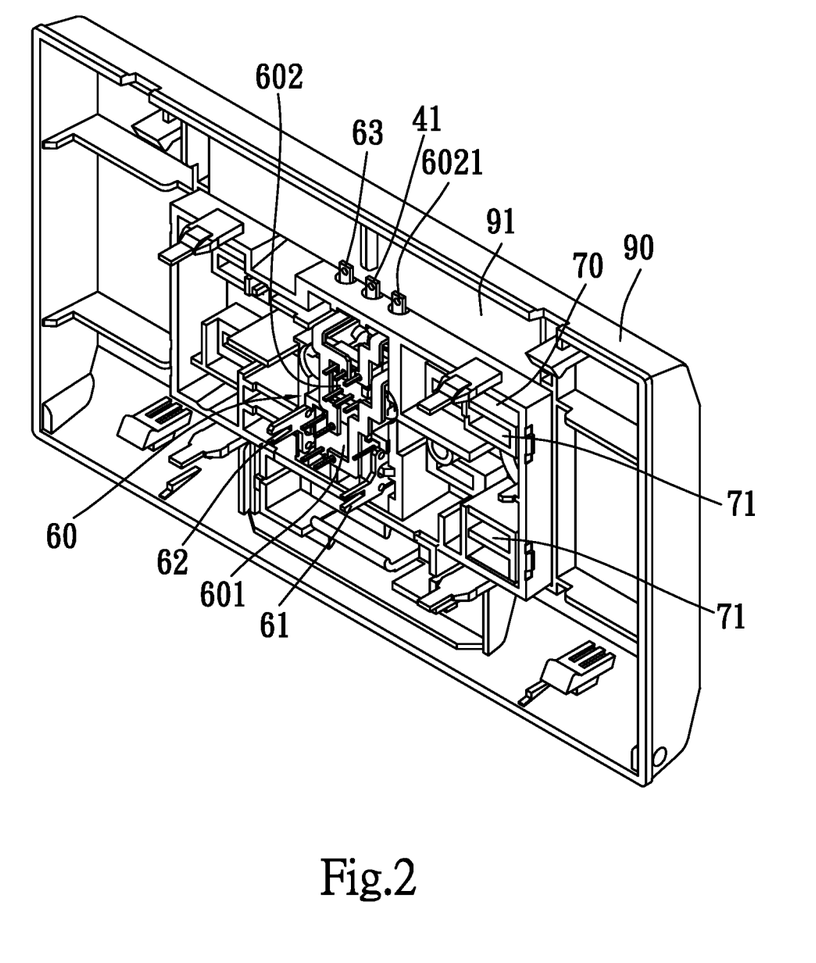
FIG. 2 is a schematic diagram illustrating the plug case received by the cover plate in accordance with the second embodiment of the present invention.

The switch 60 of the second embodiment of present invention is provided between the interior live wire circuit 30 of the base 10 and the exterior live wire circuit 20, and the configuration of the switch 60 can be referred to the first embodiment. The difference between the switch 60 configured in second embodiment and configured in first embodiment is that when the switch 60 is configured by a relay 601 and a tactile switch 602, one side of the relay 601 is combined with a first live wire metal sheet 61. One side of the relay 601 is combined with a first live wire metal sheet 61 which is connected with the interior live wire circuit 30 of the base 10 as shown in FIGS. 1 and 2, and the other side of the relay 601 is combined with a second live wire metal sheet 62 which is connected with the exterior live wire circuit 20 of the base 10 is the same. But the tactile switch 602 is combined with a signal metal sheet 63, one side of the signal metal sheet 63 is extended to connect to the relay 601, and the other side of the signal metal sheet 63 is connected with at least one module circuit board 91 of the cover plate 90. The tactile switch 602 of the switch 60 is combined with a positive terminal metal sheet 6021, and one side of the positive terminal metal sheet 6021 is electrically connected with at least one module circuit board 91 of the cover plate 90.

The cover plate 90 of the second embodiment of present invention, is provided with at least one hole 92, to receive at least one plug case 70 as shown in FIG. 1, and the plug case 70 is combined with the base 10, and the plug case 70 is provided with at least one set of holes 71 as shown in FIGS.

Figure 3:
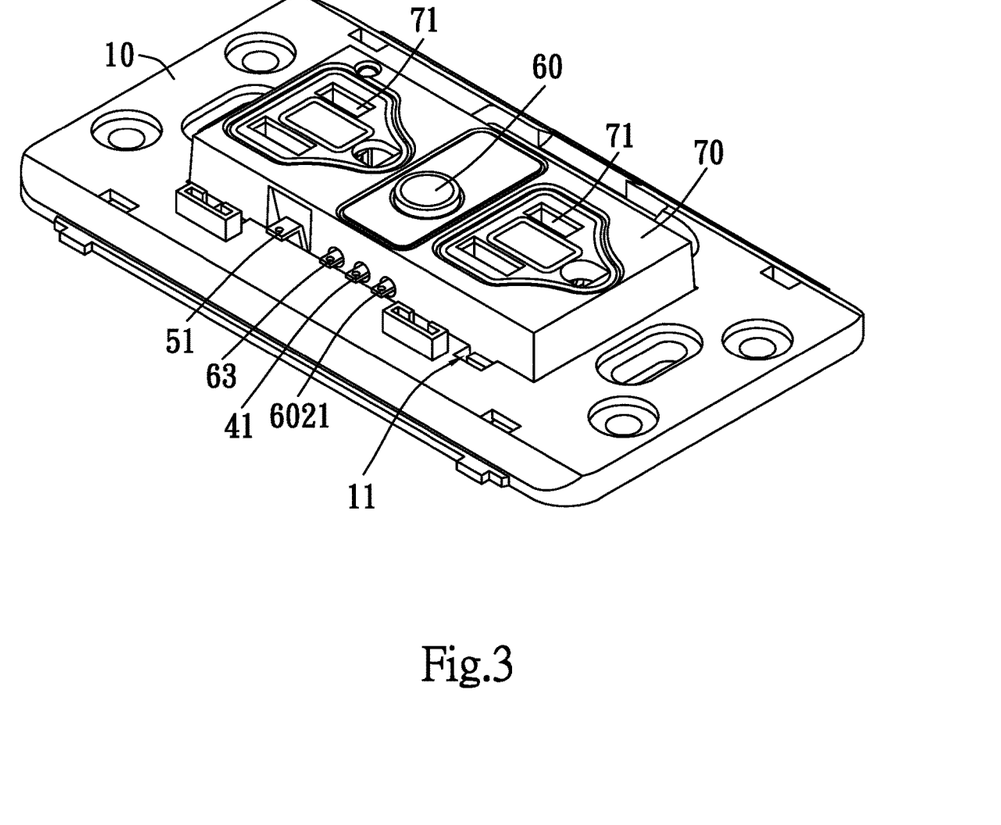
FIG. 3 is a schematic diagram illustrating the base combined with the plug case in accordance with the second embodiment of the present invention.

3 and 4. The interior live wire circuit 30 of the base 10 is combined with at least one elastic sheet 31, and the neutral wire circuit 50 is connected with at least one elastic sheet 52. The at least one set of holes 71 is separately corresponding to the position of the elastic sheet 31 of the interior live wire circuit 30 and the position of the elastic sheet 52 of the neutral wire circuit 50, for being plugged by an electrical appliance or an electrical device. When the interior live wire circuit 30 and the exterior live wire circuit 20 are formed as closed circuit and conducting state, the interior live wire circuit 30 is able to supply power via the elastic sheet 31.

Furthermore, in the second embodiment of the present invention, at least one module circuit board 91 of the cover plate 90 is electrically connected to the exterior live wire circuit 20 of the base 10 to supply power to at least one module circuit board 91. The at least one module circuit board 91 of the cover plate 90 is provided with a transformer (not shown in figures) to transformer power, transmitted by the exterior live wire circuit 20 of the base 10, to needful power. The at least one module circuit board 91 of the cover plate 90 is configured by at least one element selected from a group including a wireless transmission module circuit board, a temperature detection module circuit board, a power measurement module circuit board, a signal control module circuit board, a display module circuit board and an infrared detection module circuit board. The at least one module circuit board 91 as mentioned above is provided with a control chip, not shown in Figures, so as to attain an effect of performing control, and the module circuit board, not limited by the description of the present invention, can be the other module circuit board.

The wireless transmission module circuit board is able of connecting to at least one electronic device wirelessly, not shown in Figures, and the at least one electronic device is selected from a group including a tablet personal computer, a note book, a mobile phone, a personal digital assistant and a smart bracelet. As the result, the base 10 is able to fit or replace to any cover plate 90 provided with at least one module circuit board 91, and connects to any electronic device or network to remotely control and operate.

As can be appreciated from the above embodiments, a person skilled in the art can achieve the above object. Therefore, the present innovation patent has industry worth which meets the requirement for a patent, so that the application is submitted.

What is claimed is:

1. A wall-mounted device comprising:
    a base, provided in a wall, provided with a concave part having a central longitudinal region defined to extend around a central longitudinal line of the concave part, and a peripheral longitudinal region defined to extend next to the central longitudinal region and spaced away from the central longitudinal line of the concave part, the concave part being disposed with an interior live wire circuit extending along and disposed in the central longitudinal region of the concave part and an exterior live wire circuit extending along and disposed in the peripheral longitudinal region of the concave part, wherein the exterior live wire circuit and a live wire provided in the wall are connected in series, and a switch disposed in the concave part is provided between the interior live wire circuit and the exterior live wire circuit to control a state of current transmitting of the interior live wire circuit via the switch; and
    a cover plate, combined on the base, provided with at least one module circuit board in the cover plate, and a power terminal of at least one module circuit board being electrically connected to the exterior live wire circuit of the base to supply power to at least one module circuit board;
    wherein the concave part of the base is further disposed with a neutral wire circuit, and the neutral wire circuit and a neutral wire provided in the wall are connected in series, and the neutral wire circuit is connected with at least one elastic sheet, and is further combined with a metal sheet, one side of the metal sheet is connected to the at least one module circuit board of the cover plate;
    wherein the concave part of the base is further disposed with an earth wire circuit, and the earth wire circuit is further combined with a negative terminal metal sheet, one side of the negative terminal metal sheet is electrically connected with the at least one module circuit board of the cover plate.

2. The wall-mounted device as claimed in claim 1, wherein the exterior live wire circuit of the base is further combined with an induction coil to detect voltage and current of the exterior live wire circuit, and the exterior live wire circuit is further combined with a temperature sensor to detect temperature of the exterior live wire circuit.

3. The wall-mounted device as claimed in claim 1, wherein the interior live wire circuit is further connected with at least one elastic sheet, and the cover plate is further provided with at least one hole, to receive at least one plug case, the plug case is combined with the base, and the plug case is provided with at least one set of holes.

4. The wall-mounted device as claimed in claim 1, wherein the switch is further configured by at least one element selected from a group including tactile switch, push switch, slide switch, button switch, and relay switch.

5. The wall-mounted device as claimed in claim 1, wherein the switch is further configured by a relay and a tactile switch, one side of the relay is combined with a first live wire metal sheet which is connected with the interior live wire circuit of the base, the other side of the relay is combined with a second live wire metal sheet which is connected with the exterior live wire circuit of the base, the tactile switch is further combined with a signal metal sheet, one side of the signal metal sheet is extended to connect to the relay, and the other side of the signal metal sheet is connected with at least one module circuit board to enable the tactile switch to transmit a signal to the relay via the signal metal sheet, so as to control the open/closed state of current transmitting of the interior wire circuit.

6. The wall-mounted device as claimed in claim 5, wherein the tactile switch of the switch is further combined with a positive terminal metal sheet, and one side of the positive terminal metal sheet is electrically connected with at least one module circuit board of the cover plate.

7. The wall-mounted device as claimed in claim 1, wherein at least one module circuit board of the cover plate is further provided with a transformer to transform power, transmitted by the exterior live wire circuit of the base, to needful power.

8. The wall-mounted device as claimed in claim 1, wherein at least one module circuit board of the cover plate is configured by at least one element selected from a group including a wireless transmission module circuit board, a temperature detection module circuit board, a power measurement module circuit board, a signal control module circuit board, a display module circuit board and an infrared detection module circuit board.

9. The wall-mounted device as claimed in claim 8, wherein the wireless transmission module circuit board is further able of connecting to at least one electronic device wirelessly, and the at least one electronic device is selected from a group including a tablet personal computer, a note book, a mobile phone, a personal digital assistant and a smart bracelet.

10. A wall-mounted device comprising:
a base which is configured in a wall and provided with a concave part having a central longitudinal region defined to extend around a central longitudinal line of the concave part, and a peripheral longitudinal region defined to extend next to the central longitudinal region and spaced away from the central longitudinal line of the concave part, which is disposed with:
an exterior live wire circuit which is connected to a live wire provided in the wall in series and extending along and disposed in the peripheral longitudinal region of the concave part; and
an interior live wire circuit extending along and disposed in the central longitudinal region of the concave part, and a switch is disposed in the concave part and connectively provided between the interior live wire circuit and the exterior live wire circuit to control an open state/a closed state of current transmitting of the interior live wire circuit;
wherein the concave part is further disposed with an earth wire circuit and a neutral wire circuit, the neutral wire circuit is connected to a neutral wire circuit provided in the wall in series, and the neutral wire circuit is connected with at least one elastic sheet.

11. The wall-mounted device as claimed in claim 10, wherein the exterior live wire circuit of the base is further combined with an induction coil to detect voltage and current of the exterior live wire circuit, and the exterior live wire circuit of the base is further combined with a temperature sensor to detect temperature of the exterior live wire circuit.

12. The wall-mounted device as claimed in claim 10, wherein the interior live wire circuit of the base is further connected with at least one elastic sheet, and the base is combined to a plug case which is provided with at least one set of holes.

13. The wall-mounted device as claimed in claim 10, wherein the switch is further configured by at least one element selected from a group including tactile switch, push switch, slide switch, button switch, and relay switch.

14. The wall-mounted device as claimed in claim 10, wherein the switch is further configured by a relay and a tactile switch, one side of the relay is combined with a first live wire metal sheet which is connected with the interior live wire circuit of the base, the other side of the relay is combined with a second live wire metal sheet which is connected with the exterior live wire circuit of the base, the tactile switch is combined with a signal metal sheet, one side of the signal metal sheet is extended to connect to the relay, and the other side of the signal metal sheet is connected with at least one module circuit board to enable the tactile switch to transmit a signal to the relay via the signal metal sheet, so as to control the open/closed state of current transmitting of the interior wire circuit.

* * * * *